(12) United States Patent
Chen

(10) Patent No.: US 7,564,287 B2
(45) Date of Patent: Jul. 21, 2009

(54) HIGH VOLTAGE TOLERANT INPUT BUFFER

(75) Inventor: Chia-Hui Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/850,667

(22) Filed: Sep. 5, 2007

(65) Prior Publication Data

US 2009/0058517 A1    Mar. 5, 2009

(51) Int. Cl.
*H03L 5/00*    (2006.01)
(52) U.S. Cl. ........................ 327/310; 327/108
(58) Field of Classification Search ................ 327/108, 327/310, 312, 313
See application file for complete search history.

(56) References Cited

U.S. PATENT DOCUMENTS

| | | | | |
|---|---|---|---|---|
| 3,947,727 A | * | 3/1976 | Stewart ...................... | 361/91.5 |
| 4,791,318 A | * | 12/1988 | Lewis et al. .................. | 327/576 |
| 6,031,393 A | * | 2/2000 | Wayner ........................ | 326/81 |
| 6,064,231 A | * | 5/2000 | Kothandaraman et al. ..... | 326/83 |
| 6,184,700 B1 | * | 2/2001 | Morris ........................ | 326/14 |
| 6,724,226 B2 | * | 4/2004 | Kim ........................... | 327/108 |
| 6,897,688 B2 | * | 5/2005 | Lee et al. .................... | 327/112 |
| 7,098,694 B2 | * | 8/2006 | Bhattacharya et al. ........ | 326/81 |
| 7,271,627 B2 | * | 9/2007 | Chen ........................... | 327/108 |
| 7,388,410 B2 | * | 6/2008 | Kim et al. .................... | 327/108 |
| 7,430,100 B2 | * | 9/2008 | Bhattacharya et al. ..... | 361/91.1 |

* cited by examiner

*Primary Examiner*—Lincoln Donovan
*Assistant Examiner*—Thomas J Hiltunen
(74) *Attorney, Agent, or Firm*—K & L Gates LLP

(57) ABSTRACT

An input buffer protection circuit is disclosed which comprises a NMOS transistor with a source, drain and gate coupled to an input terminal of the input buffer, a pad and a chip peripheral positive power supply voltage (VDDP), respectively, and a PMOS transistor with a source, drain and gate coupled to the pad, the input terminal of the input buffer and a first terminal of a biasing circuit, respectively, wherein the biasing circuit has a second terminal coupled to the pad and generates at the first terminal a voltage lower than the pad's input signal voltage (VPAD) to turn on the PMOS transistor when the VPAD is lower than or equal to the VDDP, or a voltage substantial equals to the VPAD to turn off the PMOS transistor when the VPAD is higher than the VDDP.

15 Claims, 2 Drawing Sheets

HIGH VOLTAGE TOLERANT INPUT BUFFER

BACKGROUND

The present invention relates generally to designs of integrated circuits (ICs), and, more particularly, to input circuit designs of the ICs.

With the advent of sub-micron technology, device dimensions in an IC chip are getting ever smaller to gain on speed and cost. At the same time, an operating voltage of the IC chip has also to be scaled down to accommodate the shrinking dimensions, such as thinner oxides and narrower spaces. However, on a board level, signal travel to and from the IC chip still in traditional high voltages for inter-operability with other chips and for maintaining signal integrity in a much noisier board level communication. For instance, a chip in a 90 nm technology may have an internal operating voltage of 1.0 V, yet it may interface with other devices on a 2.5 V level. For such an IC chip, its input buffer must transform the high board level voltage to the low chip level voltage.

However, the board level voltage may be unstable, and given these damage-prone, small geometry devices in the IC chip, there is a need to put protection devices in front of the input buffers to dampen an accidental high input signal voltage.

FIG. 1 is schematic diagram illustrating a conventional high-voltage-tolerant input buffer protection circuit 100, which comprises a NMOS transistor 110 coupled between a pad 120 and an input buffer 130. A gate of the NMOS transistor 110 is coupled to a chip peripheral power supply voltage (VDDP) to keep the NMOS transistor 110 to be always "on". An electrostatic discharge (ESD) circuit 140 may be coupled between the NMOS transistor 110 and the pad 120 to prevent ESD damages to the NMOS transistor 110 as well as the input buffer 130 which may include an input regulating circuit 132 and a level-down converter 136. The input regulating circuit 132 receives a high voltage input signal from the pad 120, and transfers the high voltage input signal to a voltage level of either a ground (GND) or the VDDP. The level down converter 136 converts the VDDP voltage level to a chip core power supply voltage (VDD) level. The VDD is typically lower than VDDP.

When a signal voltage at the pad 120 is higher than the VDDP, the NMOS transistor 110 serves to drop some voltage across its source and drain, and to make a voltage at the input buffer 130 to be within a tolerable level.

However, when the IC chip is operated at lowered power supply environment, i.e., both the power supply VDDP and input voltage at pads are lowered, the voltage drop across the NMOS 110 further lowers the voltage received by the input buffer 130. In such lowered power supply environment, the voltage drop across the NMOS 110 may become so significant as it is compared to the input voltage at the pads that the voltage received by the input buffer 130 may approaching the threshold voltage thereof. Then the input buffer 130 may fail to operate correctly.

Such lowered power supply environment is quite common and often unpredictable in many silicon-on-chip (SOC) applications. In the SOC application, different ICs with different power supply voltages are merged in the same chip. To save the fabrication cost, a single design (e.g. circuit with 3.3V I/O devices) should be suitable for operating in different power-supply voltages (e.g., 3.3V, 2.5V, and 1.8V). Besides, for low-power design, the same IC may be operated at a lower power supply voltage during a power-saving mode. Then the conventional input buffer protection circuit 100 poses a reliability issue for the IC chip.

As such, what is desired is an input buffer protection circuit that can tolerate high voltage input as well as operate at lower-power supply voltages.

SUMMARY

In view of the foregoing, the present invention provides an input buffer which comprises a NMOS transistor with a source, drain and gate coupled to an input terminal of the input buffer, a pad and a chip peripheral positive power supply voltage (VDDP), respectively, and a PMOS transistor with a source, drain and gate coupled to the pad, the input terminal of the input buffer and a first terminal of a biasing circuit, respectively, wherein the biasing circuit has a second terminal coupled to the pad and generates at the first terminal a voltage lower than the pad's input signal voltage (VPAD) to turn on the PMOS transistor when the VPAD is lower than or equal to the VDDP, or a voltage substantial equals to the VPAD to turn off the PMOS transistor when the VPAD is higher than the VDDP.

The construction and method of operation of the invention, however, together with additional objects and advantages thereof will be best understood from the following description of specific embodiments when read in connection with the accompanying drawings.

Figure 1:
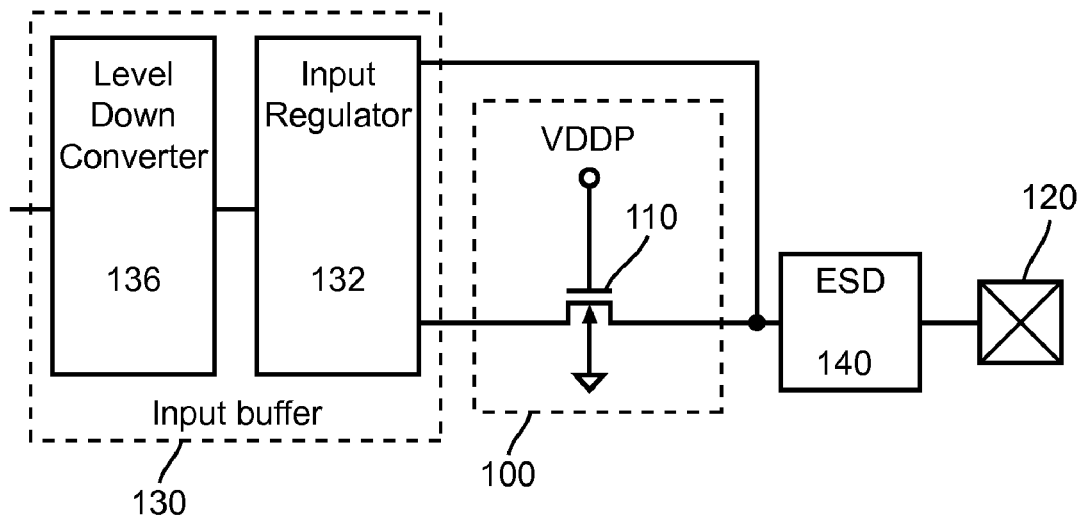
FIG. 1 is schematic diagram illustrating a conventional high-voltage-tolerant input buffer protection circuit.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of an input buffer protection circuit that can protect the input buffer when a signal voltage is higher than a chip's internal peripheral power supply voltage (VDDP), and also ensures that the input buffer will not fail when the VDDP is lowered because of the input buffer protection circuit.

Figure 2:
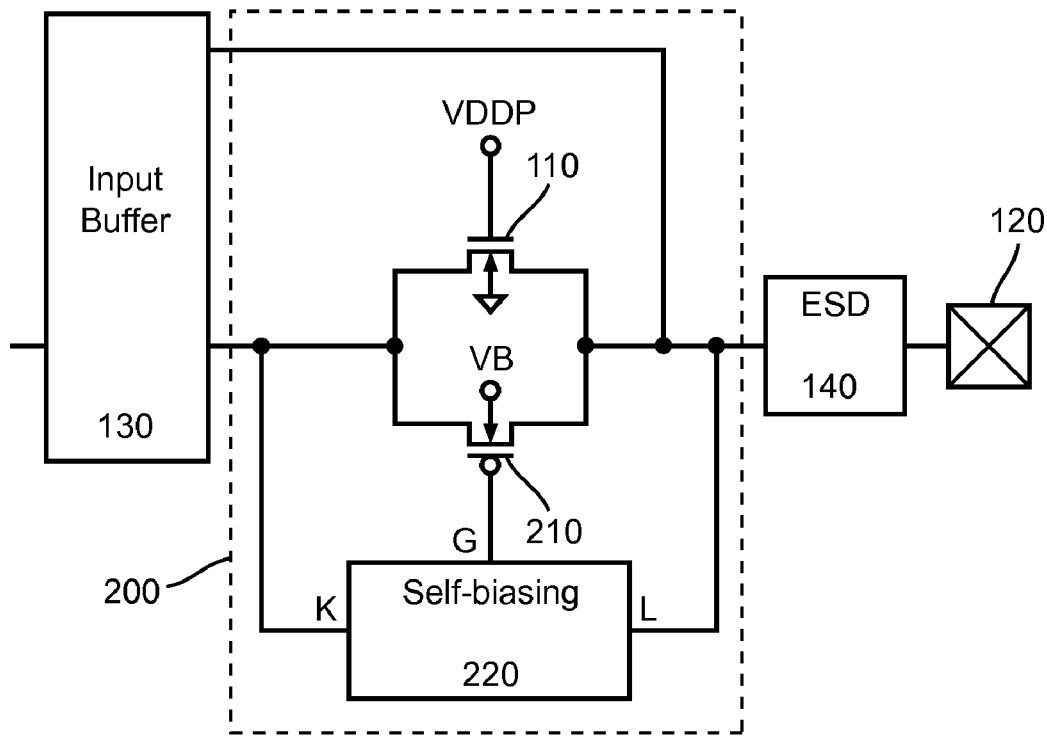
FIG. 2 is a schematic diagram illustrating an input buffer protection circuit according to one embodiment of the present invention.

FIG. 2 is a schematic diagram illustrating an input buffer protection circuit 200 according to one embodiment of the present invention. The input buffer protection circuit 200 comprises a NMOS transistor 110, a PMOS transistor 210, a self-biasing circuit 220 and an ESD circuit 140. The NMOS transistor 110 is coupled between a pad 120 and an input buffer 130 and functioned in the same way as in the prior art input buffer protection circuit 100 shown in FIG. 1. The PMOS transistor 210 is also coupled between the pad 120 and the input buffer 130, i.e., the NMOS transistor 110 and the PMOS transistor 210 are connected in parallel. A bulk of the PMOS transistor 210 is coupled to a voltage, VB, which is always coupled to a higher one of the VDDP and a pad voltage VPAD. When the VPAD is lower than VDDP, the VB equals to the VDDP, on the other hand, when the VPAD is higher than the VDDP, the VB equals to the VPAD. In silicon, the bulk of the PMOS transistor 210 may be formed by a floating Nwell, which is switched between the VPAD and VDDP. The switching is control by a voltage comparing circuit comparing the VPAD and the VDDP (not shown), for which a skilled artisan would have no difficulty to construct one.

A gate of the PMOS transistor 210 is coupled to a terminal G of a self-biasing circuit 220. Two other terminals K and L of the self-biasing circuit 220 are coupled to the input buffer 130 and the pad 120, respectively. The self-biasing circuit 220 biases the terminal G to approximately the VPAD when the VPAD is higher than or equal to the VDDP and to a voltage lower than the VDDP minus a threshold voltage of the PMOS transistor 210 when the VPAD is lower than the VDDP. In the case of the VPAD higher than the VDDP, the NMOS transistor 110 is turned on and the PMOS transistor 210 is turned off, therefore the input buffer protection circuit 200 functions in the same way as the conventional input buffer protection circuit 100 of FIG. 1, i.e., any excessive input signal voltage will drop across the NMOS transistor 110. In the case of the VPAD lower than or equal to the VDDP, the NMOS transistor 110 is still turned on, but a voltage drop across the NMOS transistor 110 may further lower the input signal voltage at the input buffer 130. However, in this case, the PMOS transistor 210 will be turned on, which can practically pass the VPAD to the input buffer 130. Therefore, the input buffer protection circuit 200 can protect the input buffer 130 when the input signal voltage is too high, and is also able not to deteriorate an already low input signal voltage.

Figure 3A:
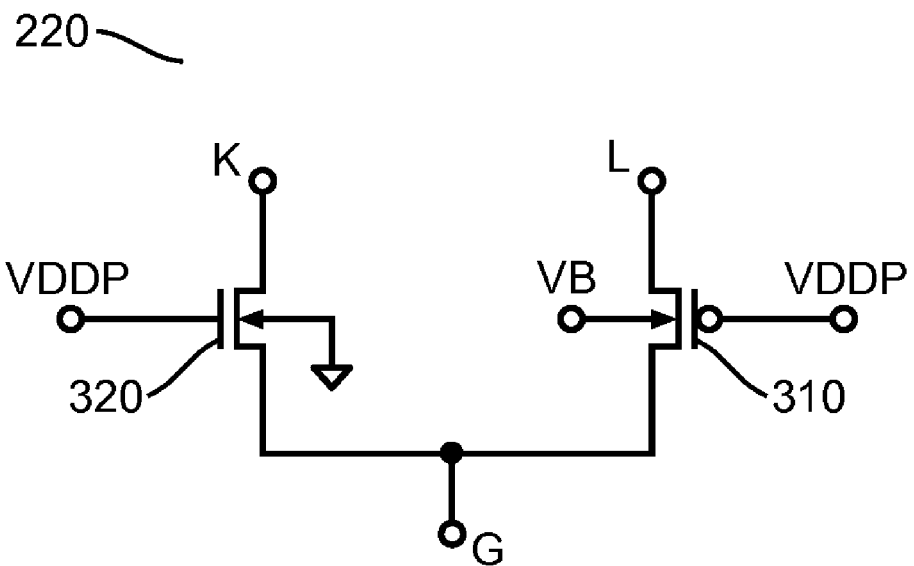
FIGS. 3A~3B are schematic diagrams illustrating two embodiments of a self-biasing circuit employed by the input buffer protection circuit of FIG. 2.
Figure 3B:
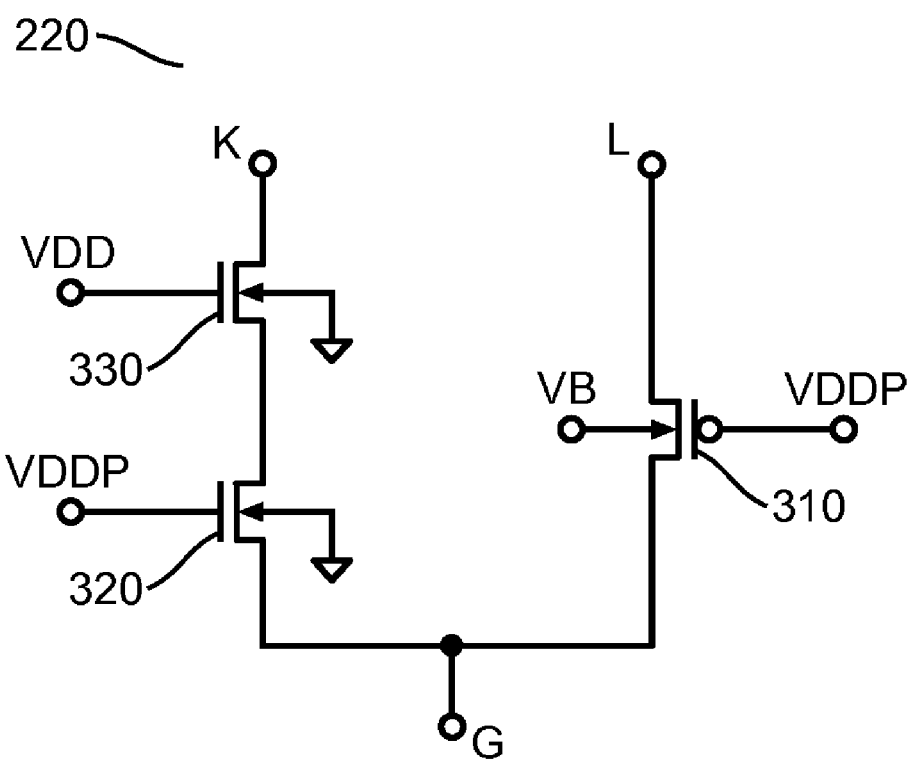

FIGS. 3A~3B are schematic diagrams illustrating two embodiments of the self-biasing circuit 220 employed by the input buffer protection circuit 200 of FIG. 2. Referring to FIG. 3A, the self-biasing circuit 220 comprises a PMOS transistor 310 and a NMOS transistor 320. A source, drain and gate of the PMOS transistor 310 is coupled to the terminal L, terminal G and the VDDP, respectively. A bulk of the PMOS transistor 310 is coupled to the VB, which is always switched to the higher one of the VDDP and the VPAD, as described earlier. A source, drain and gate of the NMOS transistor 320 is coupled to the terminal G, terminal K and the VDDP, respectively. When the VPAD, which is coupled to the terminal L, is higher than the VDDP, the PMOS transistor 310 will be turned on and bias the terminal G to VPAD to turn off PMOS 210. As described earlier, in this case, the NMOS transistor 110 of FIG. 2 is on, which drives the terminal K to the VDDP minus a voltage drop across the NMOS transistor 110 ($\Delta V1$), or (VDDP$-\Delta V1$). Therefore, the presence of the self-biasing circuit 220 will not affect the voltage at the terminal K which is driven by the NMOS transistor 110 of FIG. 2 when the VPAD is higher than the VDDP.

On the other hand, when the VPAD is lower than the VDDP, the PMOS transistor 310 will not be turned on. For the NMOS transistor 320, since the gate voltage VDDP is higher than any voltage in the input buffer protection circuit 200, the NMOS transistor 320 will be turned on, but without drawing any current beyond some leakage currents. The terminal K and terminal G become a drain and source of the NMOS transistor 320. Since the highest possible voltage at the terminal K is VPAD, then the terminal G will be biased by the NMOS transistor 320 to a voltage between the ground and (VDDP$-$VthN1), where VthN1 is a threshold voltage of the NMOS transistor 320. The VthN1 is so designed that for a given input signal voltage range, the (VDDP$-$VthN1) is lower than the VPAD, hence the PMOS transistor 320 is turned on and pass the VPAD to the terminal K or the input of the input buffer 130 of FIG. 2.

Referring to FIG. 3B, the self-biasing circuit 220 is modified by adding another NMOS transistor 330 in series between the terminal K and the NMOS transistor 320. A gate of the NMOS transistor 330 is coupled to a chip internal core voltage (VDD), which is lower than the peripheral voltage VDDP. With the addition of the NMOS transistor 330, the voltage at terminal G becomes (VDD$-$VthN2). Assuming VthN1 equals VthN2, then the voltage at terminal G is dropped even further than in the case shown in FIG. 3A, which makes the PMOS transistor 210 be more readily turned on.

Referring back to FIG. 2, although the self-biasing circuit 220 with three terminals, G, K and L, are described, in essence, the self-biasing circuit 220 just need to compared the VPAD with the VDDP, and turns on the PMOS transistor 210 when the VPAD is lower than the VDDP, and turns off the PMOS transistor 210 when the VPAD is higher than the VDDP. Therefore, the terminal K which is coupled to the input buffer 130 may not be necessary in a different implementation of the self-biasing circuit 220. A skilled artisan would certainly appreciate many other implementations of the self-biasing circuit 220 achieving the aforementioned functions.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An input buffer protection circuit comprising:
    a first NMOS transistor with a source, drain and gate coupled to an input terminal of the input buffer, a pad and a chip peripheral positive power supply voltage (VDDP), respectively; and
    a first PMOS transistor with a source, drain and gate coupled to the pad, the input terminal of the input buffer and a first terminal of a biasing circuit, respectively,
    wherein the biasing circuit further comprises:
    a second terminal coupled to the pad and generates at the first terminal a voltage lower than the pad's input signal voltage (VPAD) to turn on the PMOS transistor when the VPAD is lower than or equal to the VDDP, or a voltage substantial equals to the VPAD to turn off the PMOS transistor when the VPAD is higher than the VDDP;
    a third terminal coupled to the input terminal of the input buffer;
    a second NMOS transistor with a source, drain and gate coupled to the first terminal, the third terminal and the VDDP, respectively; and a second PMOS transistor with a source, drain and gate coupled to the second terminal, the first terminal and the VDDP, respectively.

2. The input buffer protection circuit of claim 1, wherein a bulk of the first PMOS transistor is supplied with a switching power supplier, the switching power supplier is configured to supply the VDDP when the VPAD is lower than the VDDP and to supply the VPAD when the VPAD is higher than the VDDP.

3. The input buffer protection circuit of claim 2, wherein the bulk of the first PMOS transistor is an Nwell.

4. The input buffer protection circuit of claim 1, wherein a bulk of the second PMOS transistor is supplied with a switching power supplier, the switching power supplier is configured to supply the VDDP when the VPAD is lower than the VDDP and to supply the VPAD when the VPAD is higher than the VDDP.

5. The input buffer protection circuit of claim 1, wherein the biasing circuit comprises:
a third NMOS transistor with a source, drain and gate coupled to the first terminal, the third terminal and a chip core positive power supply voltage (VDD), respectively; and
a third PMOS transistor with a source, drain and gate coupled to the second terminal, the first terminal and the VDDP, respectively.

6. The input buffer protection circuit of claim 5, wherein a bulk of the third PMOS transistor is supplied with a switching power supplier, the switching power supplier is configured to supply the VDDP when the VPAD is lower than the VDDP and to supply the VPAD when the VPAD is higher than the VDDP.

7. An input buffer protection circuit comprising:
a first NMOS transistor with a source, drain and gate coupled to an input terminal of the input buffer, a pad and a chip peripheral positive power supply voltage (VDDP), respectively; and
a first PMOS transistor with a source, drain and gate coupled to the pad, the input terminal of the input buffer and a first terminal of a biasing circuit, respectively,
wherein the biasing circuit further comprises:
a second and third terminal coupled to the pad and the input terminal of the input buffer, respectively, the biasing circuit generates at the first terminal a voltage lower than the pad's input signal voltage (VPAD) to turn on the PMOS transistor when the VPAD is lower than or equal to the VDDP, or a voltage substantial equals to the VPAD to turn off the PMOS transistor when the VPAD is higher than the VDDP;
a second NMOS transistor with a source, drain and gate coupled to the first terminal, the third terminal and the VDDP, respectively; and
a second PMOS transistor with a source, drain and gate coupled to the second terminal, the first terminal and the VDDP, respectively.

8. The input buffer protection circuit of claim 7, wherein a bulk of the first PMOS transistor is supplied with a switching power supplier, the switching power supplier is configured to supply the VDDP when the VPAD is lower than the VDDP and to supply the VPAD when the VPAD is higher than the VDDP.

9. The input buffer protection circuit of claim 7, wherein a bulk of the second PMOS transistor is supplied with a switching power supplier, the switching power supplier is configured to supply the VDDP when the VPAD is lower than the VDDP and to supply the VPAD when the VPAD is higher than the VDDP.

10. The input buffer protection circuit of claim 7, wherein the biasing circuit comprises:
a third NMOS transistor with a source, drain and gate coupled to the first terminal, the third terminal and a chip core positive power supply voltage (VDD), respectively; and
a third PMOS transistor with a source, drain and gate coupled to the second terminal, the first terminal and the VDDP, respectively.

11. The input buffer protection circuit of claim 10, wherein a bulk of the third PMOS transistor is supplied with a switching power supplier, the switching power supplier is configured to supply the VDDP when the VPAD is lower than the VDDP and to supply the VPAD when the VPAD is higher than the VDDP.

12. An input buffer protection circuit comprising:
a first NMOS transistor with a source, drain and gate coupled to an input terminal of the input buffer, a pad and a chip peripheral positive power supply voltage (VDDP), respectively; and
a first PMOS transistor with a source, drain, gate and bulk coupled to the pad, the input terminal of the input buffer, a first terminal of a biasing circuit and a switching power supplier, respectively,
wherein the biasing circuit further comprises:
a second terminal coupled to the pad and generates at the first terminal a voltage lower than the pad's input signal voltage (VPAD) to turn on the PMOS transistor when the VPAD is lower than the VDDP, or a voltage substantial equals to the VPAD to turn off the PMOS transistor when the VPAD is higher than the VDDP;
a third terminal coupled to the input terminal of the input buffer;
a second NMOS transistor with a source, drain and gate coupled to the first terminal, the third terminal and the VDDP, respectively; and
a second PMOS transistor with a source, drain and gate coupled to the second terminal, the first terminal and the VDDP, respectively, and
wherein the switching power supplier is configured to supply the VDDP when the VPAD is lower than or equal to the VDDP and to supply the VPAD when the VPAD is higher than the VDDP.

13. The input buffer protection circuit of claim 12, wherein a bulk of the second PMOS transistor is supplied with a switching power supplier, the switching power supplier is configured to supply the VDDP when the VPAD is lower than the VDDP and to supply the VPAD when the VPAD is higher than the VDDP.

14. The input buffer protection circuit of claim 12, wherein the biasing circuit comprises:
a third NMOS transistor with a source, drain and gate coupled to the first terminal, the third terminal and a chip core positive power supply voltage (VDD), respectively; and
a third PMOS transistor with a source, drain and gate coupled to the second terminal, the first terminal and the VDDP, respectively.

15. The input buffer protection circuit of claim 14, wherein a bulk of the third PMOS transistor is supplied with a switching power supplier, the switching power supplier is configured to supply the VDDP when the VPAD is lower than the VDDP and to supply the VPAD when the VPAD is higher than the VDDP.

* * * * *